US 12,412,866 B2

(12) United States Patent
Yuan et al.

(10) Patent No.: US 12,412,866 B2
(45) Date of Patent: Sep. 9, 2025

(54) BACK PLATE AND MANUFACTURING METHOD THEREOF, METHOD FOR BONDING CHIP, AND DISPLAY DEVICE

(71) Applicant: BOE Technology Group Co., Ltd., Beijing (CN)

(72) Inventors: Guangcai Yuan, Beijing (CN); Zhiwei Liang, Beijing (CN); Ke Wang, Beijing (CN); Zhanfeng Cao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 1111 days.

(21) Appl. No.: 17/418,809

(22) PCT Filed: Oct. 19, 2020

(86) PCT No.: PCT/CN2020/121888
§ 371 (c)(1),
(2) Date: Jun. 26, 2021

(87) PCT Pub. No.: WO2021/078095
PCT Pub. Date: Apr. 29, 2021

(65) Prior Publication Data
US 2022/0068873 A1 Mar. 3, 2022

(30) Foreign Application Priority Data
Oct. 22, 2019 (CN) .......................... 201911008405.9

(51) Int. Cl.
*H01L 23/00* (2006.01)
*H01L 25/16* (2023.01)
(Continued)

(52) U.S. Cl.
CPC ............ *H01L 24/81* (2013.01); *H01L 25/167* (2013.01); *H10D 86/021* (2025.01);
(Continued)

(58) Field of Classification Search
CPC ... H01L 24/81; H01L 25/167; H01L 27/1259; H01L 33/38; H01L 33/62;
(Continued)

(56) References Cited

U.S. PATENT DOCUMENTS

2009/0183911 A1    7/2009 Sunohara et al.
2019/0198488 A1*   6/2019 Wang .................... H10H 20/84
(Continued)

FOREIGN PATENT DOCUMENTS

CN    107742636 A       2/2018
CN    108183156 A   *   6/2018    ............. H01L 21/52
(Continued)

OTHER PUBLICATIONS

CN201911008405.9 first office action.

*Primary Examiner* — Ermias T Woldegeorgis
(74) *Attorney, Agent, or Firm* — IPro, PLLC

(57) ABSTRACT

A back plate and a manufacturing method thereof, a method for bonding a chip, and a display device are provided. The back plate includes: a base substrate; and, a plurality of conductive connecting tubes disposed on the base substrate, wherein one end of each of the conductive connecting tubes is connected to the base substrate, and a side wall of each of the conductive connecting tubes is provided with an opening penetrating the side wall. And, the method for bonding a chip includes: providing the back plate; inserting an electrode of the chip into a corresponding conductive connecting tube from an end of the conductive connecting tube away from the base substrate; and heating the conductive connecting tube and the chip, so that the electrode of the chip is electrically connected to the conductive connecting tube.

20 Claims, 10 Drawing Sheets

(51) Int. Cl.
*H10D 86/01* (2025.01)
*H10H 20/831* (2025.01)
*H10H 20/857* (2025.01)
*H10H 20/01* (2025.01)

(52) U.S. Cl.
CPC ........ *H10H 20/831* (2025.01); *H10H 20/857* (2025.01); *H01L 2224/11466* (2013.01); *H01L 2224/11614* (2013.01); *H01L 2224/11622* (2013.01); *H01L 2224/13018* (2013.01); *H01L 2224/13166* (2013.01); *H01L 2224/13179* (2013.01); *H01L 2224/1318* (2013.01); *H01L 2224/13184* (2013.01); *H01L 2224/81345* (2013.01); *H01L 2224/8182* (2013.01); *H01L 2924/12041* (2013.01); *H10H 20/0364* (2025.01)

(58) Field of Classification Search
CPC . H01L 2224/11466; H01L 2224/11614; H01L 2224/11622; H01L 2224/13018; H01L 2224/13166; H01L 2224/13179; H01L 2224/1318; H01L 2224/13184; H01L 2224/81345; H01L 2224/8182; H01L 2924/12041; H01L 2933/0066; H01L 24/13; H01L 24/16; H01L 25/0753; H01L 2224/81193; H01L 2224/81385; H01L 27/156; H10D 86/021; H10H 20/831; H10H 20/857; H10H 20/0364; H10H 29/142

See application file for complete search history.

(56) References Cited

U.S. PATENT DOCUMENTS

| | | |
|---|---|---|
| 2019/0237420 A1 | 8/2019 | Goward |
| 2019/0319015 A1 | 10/2019 | Schuele et al. |
| 2019/0326330 A1 | 10/2019 | Xia et al. |
| 2020/0312831 A1 | 10/2020 | He et al. |
| 2021/0098402 A1 | 4/2021 | Goward |

FOREIGN PATENT DOCUMENTS

| | | | | |
|---|---|---|---|---|
| CN | 109859647 A | 6/2019 | | |
| CN | 110047866 A | 7/2019 | | |
| CN | 110085568 A | 8/2019 | | |
| CN | 110600497 A | 12/2019 | | |
| EP | 3316303 A1 * | 5/2018 | ............... | G09G 3/32 |
| IN | 109300919 A | 2/2019 | | |
| JP | 2000183507 A * | 6/2000 | ............... | H01L 24/11 |
| JP | 2009170849 A | 7/2009 | | |

* cited by examiner

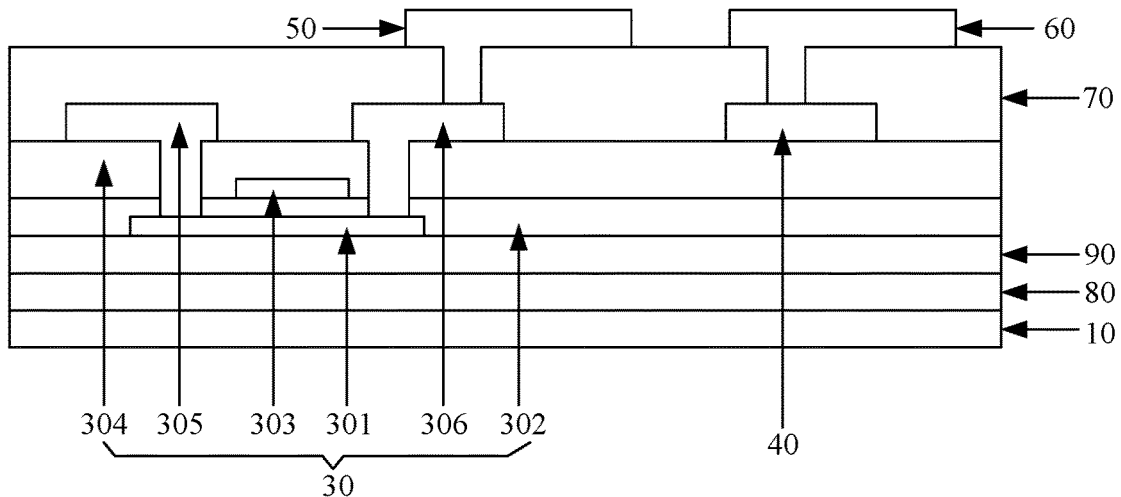

FIG. 7

| Forming a base film layer on the side of the first lead-out electrode and the second lead-out electrode away from the base substrate, wherein the base film layer has a plurality of via holes | 2061 |
|---|---|
| Forming a metal layer on the side of the base film layer away from the base substrate, wherein the metal layer is at least partially disposed in the plurality of via holes, and the portions of the metal layer disposed in the plurality of via holes are in one-to-one correspondence with the plurality of conductive connecting tubes to be formed | 2062 |
| Processing the metal layer by a patterning process to obtain the plurality of conductive connecting tubes with openings, wherein the conductive connecting tubes are in one-to-one correspondence with the plurality of via holes | 2063 |

FIG. 8

BACK PLATE AND MANUFACTURING METHOD THEREOF, METHOD FOR BONDING CHIP, AND DISPLAY DEVICE

This application is a 371 of International Application No. PCT/CN2020/121888, filed on Oct. 19, 2020, which claims priority to Chinese Patent Application No. 201911008405.9, filed on Oct. 22, 2019 and entitled "BACKPLATE AND FABRICATION METHOD THEREFOR, CHIP BONDING METHOD AND DISPLAY DEVICE", the entire contents of both of which are incorporated herein by reference.

TECHNICAL FIELD

The present disclosure relates to a back plate and a manufacturing method thereof, a method for bonding a chip, and a display device.

BACKGROUND

Micro light-emitting diode (micro LED) displays have many advantages, such as self-illumination, high luminance, high contrast, ultra-high resolution and color saturation, long service life, fast response speed, energy saving and robust adaptation to environment, and thus have wide application prospects in the display field. For example, micro LED displays can be applied to small display devices, such as augmented reality (AR)/virtual reality (VR), medium-scale display devices, such as mobile phones and televisions, and large-scale display devices, such as large theater screens. When the micro LED display is prepared, a micro LED chip needs to be bonded to a display back plate.

SUMMARY

The present disclosure provides a back plate and a manufacturing method thereof, a method for bonding chip, and a display device. The technical solutions of the present disclosure are as follows.

In a first aspect, a back plate is provided. The back plate includes:
 a base substrate; and,
 a plurality of conductive connecting tubes disposed on the base substrate, wherein one end of the conductive connecting tube is connected to the base substrate, and a side wall of the conductive connecting tube is provided with an opening penetrating the side wall.

Optionally, the opening is disposed in the side wall at the end of the conductive connecting tube connected to the base substrate.

Optionally, a thickness of the side wall at the end of the conductive connecting tube connected to the base substrate is greater than or equal to 1000 angstroms.

Optionally, the opening penetrates the side wall of the conductive connecting tube along an axial direction of the conductive connecting tube.

Optionally, a thickness of the side wall of the conductive connecting tube is greater than or equal to 1000 angstroms.

Optionally, an extending length of the opening in a circumferential direction of the conductive connecting tube is less than or equal to one-sixth of a circumferential length of the conductive connecting tube.

Optionally, a material of the conductive connecting tube comprises at least one of tungsten, niobium, titanium and molybdenum.

Optionally, the back plate further includes: a thin film transistor and a common electrode which are disposed on the base substrate, and the conductive connecting tubes are disposed on a side of the thin film transistor and the common electrode away from the base substrate; and
 the plurality of conductive connecting tubes includes a first conductive connecting tube and a second conductive connecting tube, wherein the first conductive connecting tube is electrically connected to the thin film transistor, and the second conductive connecting tube is electrically connected to the common electrode.

Optionally, the back plate further includes: a first lead-out electrode and a second lead-out electrode, wherein the first conductive connecting tube is electrically connected to the thin film transistor via the first lead-out electrode, and the second conductive connecting tube is electrically connected to the common electrode via the second lead-out electrode.

Optionally, the first lead-out electrode and the second lead-out electrode are disposed on the side of the thin film transistor and the common electrode away from the base substrate; and
 the conductive connecting tubes are disposed on a side of the first lead-out electrode and the second lead-out electrode away from the base substrate.

Optionally, the back plate further includes: an insulating layer having a first via hole and disposed between the thin film transistor and the first lead-out electrode, and an insulating layer having a second via hole and disposed between the common electrode and the second lead-out electrode, wherein the first lead-out electrode is electrically connected to the thin film transistor via the first via hole, and the second lead-out electrode is electrically connected to the common electrode via the second via hole.

Optionally, the back plate further includes: a flexible base layer and a buffer layer which are disposed between the base substrate and the thin film transistor, wherein the flexible base layer and the buffer layer are distributed in a direction away from the base substrate.

In a second aspect, a method for manufacturing a back plate is provided. The method includes:
 providing a base plate; and
 forming a plurality of conductive connecting tubes on the base substrate, wherein one end of the conductive connecting tube is connected to the base substrate, and a side wall of the conductive connecting tube is provided with an opening penetrating the side wall.

Optionally, forming the plurality of conductive connecting tubes on the base substrate includes:
 forming a base film layer on the base substrate, wherein the base film layer has a plurality of via holes;
 forming a metal layer on a side of the base film layer away from the base substrate, wherein the metal layer is at least partially disposed in the plurality of via holes, and portions of the metal layer disposed in the plurality of via holes are in one-to-one correspondence with the plurality of conductive connecting tubes;
 processing the metal layer by a patterning process, to obtain the plurality of conductive connecting tubes with the openings, wherein the conductive connecting tubes are in one-to-one correspondence with the plurality of via holes; and removing the base film layer.

Optionally, processing the metal layer by the patterning process to obtain the plurality of conductive connecting tubes with the openings includes:
 forming photoresist in the plurality of via holes, so that the photoresist in each via hole covers a portion of the metal layer on the side wall of the via hole;

etching the metal layer by taking the photoresist as a mask, to obtain the plurality of conductive connecting tubes with the openings; and removing the photoresist.

Optionally, prior to forming the plurality of conductive connecting tubes on the base substrate, the method further includes: forming a thin film transistor and a common electrode on the base substrate; and forming the plurality of conductive connecting tubes on the base substrate includes: forming the plurality of conductive connecting tubes on a side of the thin film transistor and the common electrode away from the base substrate, wherein the plurality of conductive connecting tubes include a first conductive connecting tube and a second conductive connecting tube, the first conductive connecting tube is electrically connected to the thin film transistor, and the second conductive connecting tube is electrically connected to the common electrode.

Optionally, prior to forming the plurality of conductive connecting tubes on the side of the thin film transistor and the common electrode away from the base substrate, the method further includes: forming a first lead-out electrode and a second lead-out electrode on the side of the thin film transistor and the common electrode away from the base substrate, wherein the first lead-out electrode is electrically connected to the thin film transistor, and the second lead-out electrode is electrically connected to the common electrode; and forming the plurality of conductive connecting tubes on the side of the thin film transistor and the common electrode away from the base substrate includes: forming the plurality of conductive connecting tubes on a side of the first lead-out electrode and the second lead-out electrode away from the base substrate, wherein the first conductive connecting tube is electrically connected to the first lead-out electrode, and the second conductive connecting tube is electrically connected to the second lead-out electrode.

Optionally, prior to forming the first lead-out electrode and the second lead-out electrode on the side of the thin film transistor and the common electrode away from the base substrate, the method further includes: forming an insulating layer on the side of the thin film transistor and the common electrode away from the base substrate, wherein the insulating layer has a first via hole and a second via hole; and forming the first lead-out electrode and the second lead-out electrode on the side of the thin film transistor and the common electrode away from the base substrate includes: forming the first lead-out electrode and the second lead-out electrode on a side of the insulating layer away from the base substrate, wherein the first lead-out electrode is electrically connected to the thin film transistor via the first via hole, and the second lead-out electrode is electrically connected to the common electrode via the second via hole.

Optionally, prior to forming the thin film transistor and the common electrode on the base substrate, the method further includes: sequentially forming a flexible base layer and a buffer layer on the base substrate; and prior to forming the thin film transistor and the common electrode on the base substrate, the method includes forming the thin film transistor and the common electrode on a side of the buffer layer away from the base substrate.

In a third aspect, a method for bonding a chip is provided. The method includes:

providing a back plate, wherein the back plate includes a base substrate and a plurality of conductive connecting tubes disposed on the base substrate, one end of the conductive connecting tube is connected to the base substrate, and a side wall of the conductive connecting tube is provided with an opening penetrating the side wall;

inserting an electrode of the chip into the conductive connecting tube from an end of the conductive connecting tube away from the base substrate; and heating the conductive connecting tube and the chip, so that the electrode of the chip is electrically connected to the conductive connecting tube.

Optionally, the electrode of the chip includes an anode and a cathode, and the plurality of conductive connecting tubes include a first conductive connecting tube and a second conductive connecting tube; and inserting the electrode of the chip into the conductive connecting tube from the end of the conductive connecting tube away from the base substrate includes:

inserting the anode of the chip into the first conductive connecting tube from an end of the first conductive connecting tube away from the base substrate, and inserting the cathode of the chip into the second conductive connecting tube from an end of the second conductive connecting tube away from the base substrate.

In a fourth aspect, a display device is provided. The display device includes a chip and the back plate as defined in the first aspect. The chip is bonded to the back plate with the method as defined in the third aspect.

Optionally, hardness of the electrode of the chip is less than hardness of the conductive connecting tube.

Optionally, a material of the electrode of the chip comprises at least one of indium, copper, silver, gold and aluminum.

Optionally, the chip is a micro light-emitting diode chip.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

Other features, objectives and advantages of the present disclosure will become more apparent by reading the detailed description of non-limiting embodiments with reference to the following accompanying drawings.

FIG. 7 is a schematic diagram after forming a flexible base layer, a buffer layer, a thin film transistor, a common electrode, an insulating layer, a first lead-out electrode, and a second lead-out electrode on a base substrate according to an embodiment of the present disclosure;

FIG. 8 is a flowchart of forming a conductive connecting tube according to an embodiment of the present disclosure;

DETAILED DESCRIPTION

Figure 1:
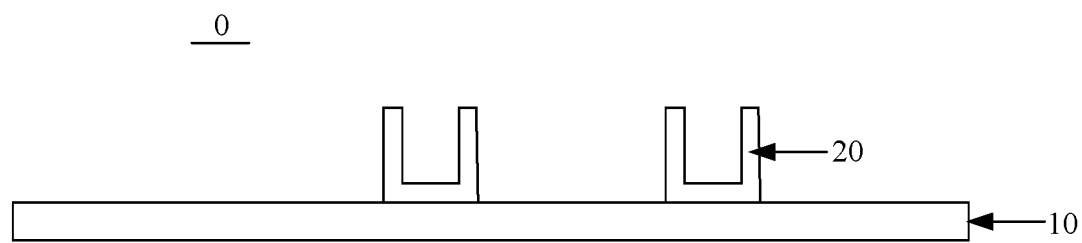
FIG. 1 is a schematic structural diagram of a back plate according to an embodiment of the present disclosure.

The present disclosure will be further described below in combination with the accompanying drawings and embodiments. It is to be understood that the embodiments described here are merely intended to explain related applications, but not to limit the present disclosure. In addition, for ease of description, only parts related to the present disclosure are shown in the accompanying drawings. In the case of no conflict, the features in the embodiments of the present disclosure can be combined with each other. Hereinafter, the present disclosure is described with reference to the accompanying drawings and in conjunction with the embodiments.

The micro LED chip is a micro-sized LED chip, which is a thin film, miniaturized and arrayed LED chip. The size of the micro LED chip is generally less than 100 um (micrometers), and is about 1% (percentage) of the size of an LED chip. When the micro LED display is prepared, the micro LED chip needs to be bonded to a display back plate.

Currently, the micro LED chip may be bonded to the display back plate by a conductive connecting tube. In an exemplary embodiment, the display back plate includes a conductive connecting tube, and the conductive connecting tube is of a hollow structure. One end of the conductive connecting tube is electrically connected to the display back plate. When the micro LED chip is bonded to the display back plate, an electrode of the micro LED chip is inserted into the conductive connecting tube from the end of the conductive connecting tube away from the display back plate first, such that this electrode part of the micro LED chip enters the inner cavity of the conductive connecting tube. Then, the micro LED chip and the conductive connecting tube are heated, such that molecules of the electrode of the micro LED chip and molecules of the conductive connecting tube are mutually diffused. Therefore, the electrode of the micro LED chip and the conductive connecting tube are fixedly connected and conducted to realize the bonding of the micro LED chip and the conductive connecting tube, such that the micro LED chip is bonded to the display back plate by the conductive connecting tube.

However, in the process of heating the conductive connecting tube, air in the inner cavity of the conductive connecting tube easily expands, resulting in that the micro LED chip and the conductive connecting tube cannot be fixedly connected, or the micro LED chip and the conductive connecting tube cannot be conducted, which affects the reliability of bonding between the micro LED chip and the display back plate. For example, bonding failure of the micro LED chip and the display back plate may occur.

In view of the above, the embodiments of the present disclosure provide a back plate and a manufacturing method thereof, a method for bonding a chip, and a display device. The back plate may be a display back plate. The back plate includes a base substrate and a conductive connecting tube disposed on the base substrate. A side wall of the conductive connecting tube is provided with an opening penetrating the side wall. In the process that the conductive connecting tube is heated after an electrode of the chip (for example, the micro LED chip) is inserted into the conductive connecting tube, air in the inner cavity of the conductive connecting tube can be discharged through the opening, which is favorable to ensure the reliability of bonding between the chip and the back plate. The detailed solutions of the present disclosure are introduced below in conjunction with the accompanying drawings.

Please refer to FIG. 1, which shows a schematic structural diagram of a back plate 0 according to an embodiment of the present disclosure. The back plate 0 includes: a base substrate 10, and a plurality of conductive connecting tubes 20 (two conductive connecting tubes 20 are shown in FIG. 1) disposed on the base substrate 10. One end of the conductive connecting tube 20 is connected to the base substrate 10, and the other end is configured to be bonded to the chip. A side wall of the conductive connecting tube 20 is provided with an opening (not shown in FIG. 1) penetrating the side wall. As shown in FIG. 1, the conductive connecting tube 20 is of a hollow structure. The end of the conductive connecting tube 20 connected to the base substrate 10 is closed, and the end of the conductive connecting tube 20 away from the base substrate 10 is open. Optionally, the conductive connecting tube 20 may be of a hollow structure with two open ends, and the side wall of the conductive connecting tube 20 is provided with an opening, which is not limited in the embodiments of the present disclosure.

Figure 2:
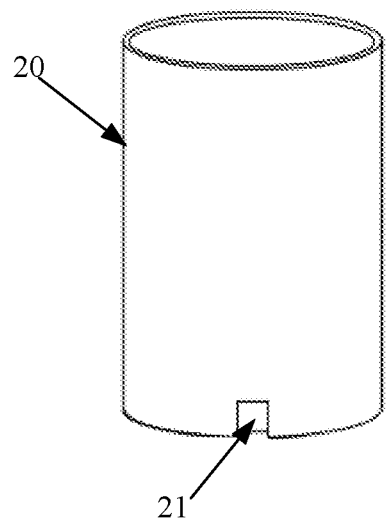
FIG. 2 is a perspective view of a conductive connecting tube according to an embodiment of the present disclosure.
Figure 3:
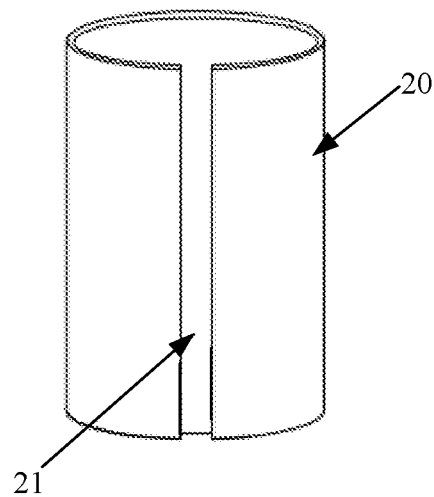
FIG. 3 is a perspective view of another conductive connecting tube according to an embodiment of the present disclosure.

In an exemplary embodiment, please refer to FIG. 2 and FIG. 3, which show perspective views of two types of conductive connecting tubes 20 according to embodiments of the present disclosure. Both FIG. 2 and FIG. 3 take the example in which the conductive connecting tube 20 is of a hollow structure with two open ends for illustration. The side wall of the conductive connecting tube 20 is provided with an opening 21 penetrating the side wall. As shown in FIG. 2, the opening 21 is disposed in the side wall at one end of the conductive connecting tube 20. For example, the opening 21 is disposed in the side wall at the end of the conductive connecting tube 20 connected to the base substrate 10. As shown in FIG. 3, the opening 21 penetrates the side wall of the conductive connecting tube 20 along an axial direction of the conductive connecting tube 20. That is, the opening 21 is a gap penetrating the side wall of the conductive connecting tube 20.

In the embodiment of the present disclosure, when the chip (for example, the micro LED chip) is bonded to the back plate 0, the electrode of the chip is first inserted into the conductive connecting tube 20 from the end of the conductive connecting tube 20 away from the base substrate 10, and this electrode part of the chip enters the inner cavity of the conductive connecting tube 20. Then, the chip and the conductive connecting tube 20 are heated, so that molecules of the electrode of the chip and molecules of the conductive connecting tube 20 are mutually diffused. Therefore, the electrode of the chip and the conductive connecting tube 20 are fixedly connected and conducted, to realize the bonding between the electrode of the chip and the conductive connecting tube 20. A stable electrical connection is established between the electrode of the chip and the conductive connecting tube 20, and the chip is bonded to the back plate 0 by the conductive connecting tube 20. In the process of heating the conductive connecting tube 20, air in the inner cavity of the conductive connecting tube 20 can be discharged through the opening 21 in the side wall of the conductive connecting tube 20, which ensures the reliability of bonding between the chip and the back plate 0.

In the process of bonding the chip to the back plate 0, in an ideal state, the electrode of the chip can be completely inserted into the inner cavity of the conductive connecting tube 20, and the bonding effect between the chip and the back plate 0 is the best. In the embodiment of the present disclosure, the opening 21 is disposed in the side wall at the end of the conductive connecting tube 20 close to the base substrate 10, such that after the electrode of the chip is inserted into the conductive connecting tube 20, or in the process of heating the chip and the conductive connecting tube 20, the opening 21 in the side wall of the conductive connecting tube 20 is not blocked by the electrode of the chip, which can ensure that the air in the inner cavity of the conductive connecting tube 20 is smoothly discharged through the opening 21. In other words, if the opening 21 is disposed in the side wall at the end of the conductive connecting tube 20 away from the base substrate 10, after the electrode of the chip is inserted into the conductive connecting tube 20, or in the process of heating the chip and the conductive connecting tube 20, the opening 21 in the side wall of the conductive connecting tube 20 may be blocked by the electrode of the chip, resulting in that the air in the inner cavity of the conductive connecting tube 20 cannot be smoothly discharged through the opening 21. It can be seen that, in the embodiment of the present disclosure, disposing the opening 21 in the side wall at the end of the conductive connecting tube 20 close to the base substrate 10 is favorable to ensure that the air in the inner cavity of the conductive connecting tube 20 can be smoothly discharged through the opening 21 in the process of bonding the chip to the back plate 0, which ensures the air discharge effect of the opening 21. It is easily understood for those skilled in the art that the opening 21 is disposed to penetrate the side wall of the conductive connecting tube 20 along the axial direction of the conductive connecting tube 20 (that is, the opening 21 is a through hole penetrating the side wall of the conductive connecting tube 20 along the axial direction of the conductive connecting tube 20), which is also favorable to ensure the air discharge effect of the opening 21. In addition, the difficulty of the process of forming the opening 21 can be reduced. That is, it is convenient to form the opening 21 in the side wall of the conductive connecting tube 20, and the difficulty of the process of forming the opening 21 in the side wall of the conductive connecting tube 20 is reduced.

In the embodiment of the present disclosure, one or more openings are formed in the side wall of the conductive connecting tube. For example, both FIG. 2 and FIG. 3 take an example in which one opening is formed in the side wall of the conductive connecting tube 20 for illustration. If one opening is formed in the side wall of the conductive connecting tube, the mechanical strength of the conductive connecting tube can be ensured while air discharge is achieved. If a plurality of openings are formed in the side wall of the conductive connecting tube, a better air discharge effect can be ensured. For example, if one opening in the side wall of the conductive connecting tube is blocked, the air in the inner cavity of the conductive connecting tube can still be discharged. Optionally, if a plurality of openings are formed in the side wall of the conductive connecting tube, the plurality of openings may all be disposed in the side wall at the end of the conductive connecting tube close to the base substrate, or all of the plurality of openings may penetrate the side wall of the conductive connecting tube along the axial direction of the conductive connecting tube. Alternatively, some of the plurality of openings are disposed in the side wall at the end of the conductive connecting tube close to the base substrate, and other openings penetrate the side wall of the conductive connecting tube along the axial direction of the conductive connecting tube, which is not limited in the embodiments of the present disclosure. In addition, FIG. 2 and FIG. 3 both take an example in which the opening 21 is a rectangular opening for illustration. The shape of the opening 21 is not limited in the embodiments of the present disclosure.

Optionally, an extending length of the opening 21 in a circumferential direction of the conductive connecting tube 20 is less than or equal to one-sixth of a circumferential length of the conductive connecting tube 20. In this way, the impact on the mechanical strength of the conductive connecting tube 20 caused by the excessive extending length of the opening 21 in the circumferential direction of the conductive connecting tube 20 can be avoided, which is favorable to ensure the mechanical strength of the conductive connecting tube 20, thereby ensuring the reliability of bonding between the chip and the back plate 0. The opening 21 may be a rectangular opening. The extending length of the opening 21 in the circumferential direction of the conductive connecting tube 20 may be referred to as the width of the opening 21, and the extending length of the opening 21 along the axial direction of the conductive connecting tube 20 may be referred to as the length of the opening 21, which is not limited in the embodiments of the present disclosure.

Optionally, the thickness of the side wall at the end of the conductive connecting tube 20 connected to the base substrate 10 is greater than or equal to 1000 Å (angstroms), or the thickness of the side wall of the conductive connecting tube 20 is greater than or equal to 1000 Å (that is, the thickness of each part of the side wall of the conductive connecting tube 20 is greater than or equal to 1000 Å). By setting the thickness of the side wall of at the end of the conductive connecting tube 20 connected to the base substrate 10 to be greater than or equal to 1000 Å, the mechanical strength of the end of the conductive connecting tube 20 connected to the base substrate 10 can be ensured and the opening 21 in the side wall at the end of the conductive connecting tube 20 connected to the base substrate 10 is prevented from affecting the mechanical strength of the conductive connecting tube 20. By setting the thickness of the side wall of the conductive connecting tube 20 to be greater than or equal to 1000 Å, the mechanical strength of the conductive connecting tube 20 can be ensured and the opening 21 in the side wall of the conductive connecting tube 20 is prevented from affecting the mechanical strength of the conductive connecting tube 20.

Optionally, the material of the conductive connecting tube 20 includes at least one of tungsten, niobium, titanium, and molybdenum. Tungsten, niobium, titanium, molybdenum and the like have higher mechanical strength and better electrical conductivity, which is favorable to ensure the mechanical strength and electrical conductivity of the conductive connecting tube 20.

Figure 4:
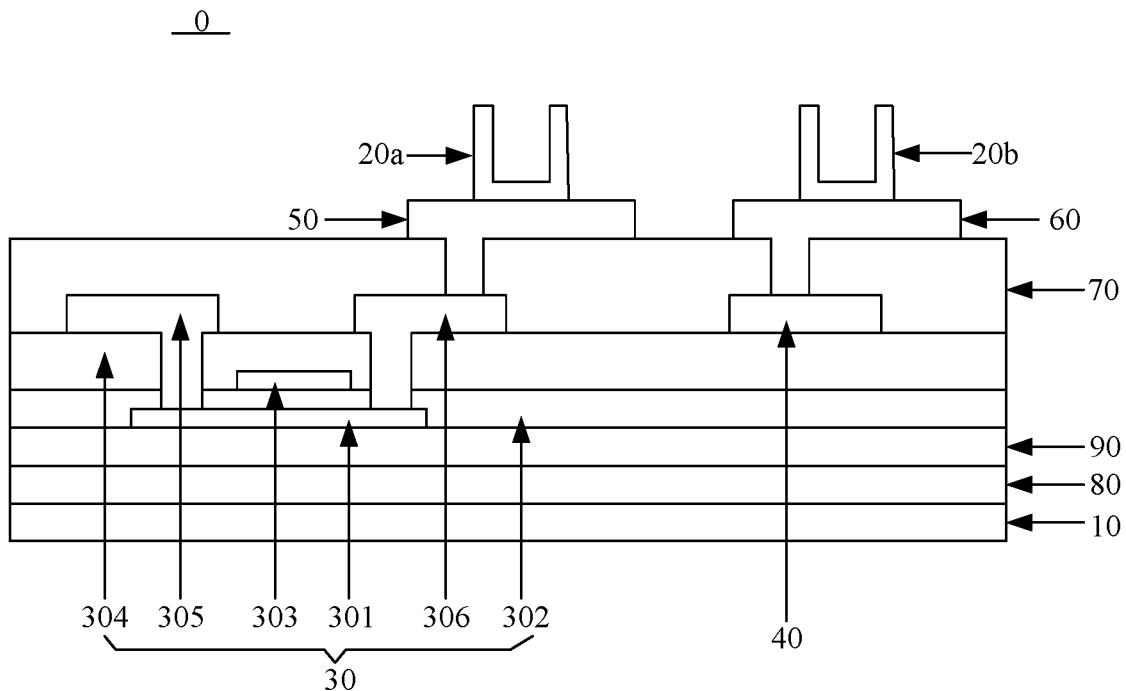
FIG. 4 is a schematic structural diagram of another back plate according to an embodiment of the present disclosure.

Optionally, please refer to FIG. 4, which shows a schematic structural diagram of another back plate 0 according to an embodiment of the present disclosure. The back plate 0 further includes: a thin film transistor 30 and a common electrode 40 which are disposed on the base substrate 10. The plurality of conductive connecting tubes 20 are disposed on the side of the thin film transistor 30 and the common electrode 40 away from the base substrate 10. The plurality of conductive connecting tubes 20 include a first conductive connecting tube 20a and a second conductive connecting tube 20b. The first conductive connecting tube 20a is electrically connected to the thin film transistor 30, and the second conductive connecting tube 20b is electrically connected to the common electrode 40. Optionally, the thin film transistor includes a source and a drain, and the first conductive connecting tube is electrically connected to the source or the drain of the thin film transistor. In an exemplary embodiment, when the thin film transistor is an N-channel metal oxide semiconductor (NMOS) transistor, the first conductive connecting tube is electrically connected to the source of the thin film transistor. When the thin film transistor is a P-channel metal oxide semiconductor (PMOS) transistor, the first conductive connecting tube is electrically connected to the drain of the thin film transistor. As shown in FIG. 4, the thin film transistor 30 includes: an active layer 301, a gate insulating layer 302, a gate 303, an interlayer dielectric layer 304, a source 305 and a drain 306. The source 305 and the drain 306 are disposed in the same layer. The active layer 301, the gate insulating layer 302, the gate 303, the interlayer dielectric layer 304 and the source 305 are distributed in the direction away from the base substrate 10. The first conductive connecting tube 20a is electrically connected to the drain 306 of the thin film transistor 30. The thin film transistor 30 may be a PMOS transistor. As shown in FIG. 4, the common electrode 40, the source 305 and the drain 306 are disposed in the same layer.

In the process of bonding the chip to the back plate, the first conductive connecting tube is configured to be electrically connected with the cathode of the chip, and the second conductive connecting tube is configured to be electrically connected with the anode of the chip. Alternatively, the first conductive connecting tube is configured to be electrically connected with the anode of the chip, and the second conductive connecting tube is configured to be electrically connected with the cathode of the chip, which is not limited in the embodiments of the present disclosure. The common electrode is generally a common cathode. Therefore, the common electrode is configured to be electrically connected with the cathode of the chip. As shown in FIG. 4, the second conductive connecting tube 20b is electrically connected to the common electrode 40. Therefore, in the back plate 0 as shown in FIG. 4, the first conductive connecting tube 20a is configured to be electrically connected with the anode of the chip, and the second conductive connecting tube 20b is configured to be electrically connected with the cathode of the chip.

Optionally, please continue referring to FIG. 4, the back plate 0 further includes: a first lead-out electrode 50 and a second lead-out electrode 60. The first conductive connecting tube 20a is electrically connected to the thin film transistor 30 via the first lead-out electrode, and the second conductive connecting tube 20b is electrically connected to the common electrode 40 via the second lead-out electrode 60. The first lead-out electrode 50 and the second lead-out electrode 60 are insulated from each other. Optionally, the first lead-out electrode 50 and the second lead-out electrode 60 are disposed in the same layer, and the first lead-out electrode 50 and the second lead-out electrode 60 are both disposed on the side of the thin film transistor 30 and the common electrode 40 away from the base substrate 10. The conductive connecting tubes are disposed on the side of the first lead-out electrode 50 and the second lead-out electrode 60 away from the base substrate 10. The first lead-out electrode 50 may lead the thin film transistor 30 out, to facilitate the electrical connection between the first conductive connecting tube 20a and the thin film transistor 30. The second lead-out electrode 60 may lead the common electrode 40 out, to facilitate the electrical connection between the second conductive connecting tube 20b and the common electrode 40. As described above, when the thin film transistor is an NMOS transistor, the first conductive connecting tube is electrically connected to the source of the thin film transistor. When the thin film transistor is a PMOS transistor, the first conductive connecting tube is electrically connected to the drain of the thin film transistor. In the embodiment of the present disclosure, as shown in FIG. 4, since the thin film transistor 30 is a PMOS transistor, the first lead-out electrode 50 leads the drain 306 of the thin film transistor 30 out, and the first conductive connecting tube 20a is electrically connected to the drain 306 of the thin film transistor 30 via the first lead-out electrode 50.

Optionally, the back plate further includes: an insulating layer between the thin film transistor and the first lead-out electrode, and an insulating layer between the common electrode and the second lead-out electrode. Here, the insulating layer between the thin film transistor and the first lead-out electrode and the insulating layer between the common electrode and the second lead-out electrode may be the same insulating layer or different insulating layers. Besides, the insulating layer may be of a single-layer structure or multilayered structure (for example, the insulating layer is formed by at least two insulating layers in a laminated fashion), which is not limited in the embodiments of the present disclosure. In the embodiment of the present disclosure, the case that the insulating layer between the thin film transistor and the first lead-out electrode and the insulating layer between the common electrode and the second lead-out electrode are the same insulating layer is taken as an example for explanation. As shown in FIG. 4, the back plate 0 further includes: an insulating layer 70. A first via hole (not marked in FIG. 4) and a second via hole (not marked in FIG. 4) are formed in the insulating layer 70. The first lead-out electrode 50 is electrically connected to the thin film transistor 30 (specifically, the first lead-out electrode 50 is electrically connected to the drain 306 of the thin film transistor 30) via the first via hole, and the second lead-out electrode 60 is electrically connected to the common electrode 40 via the second via hole. The insulating layer 70 may be of a multilayered structure, which is formed by two film layers in a laminated fashion. In an exemplary embodiment, the two film layers include a planarization layer and a passivation layer. The thickness of the planarization layer may be 3.0 to 4.0 microns, which is not limited in the embodiments of the present disclosure.

In the embodiment of the present disclosure, the first conductive connecting tube 20a is electrically connected to the thin film transistor 30 via the first lead-out electrode 50, and the second conductive connecting tube 20b is electrically connected to the common electrode 40 via the second lead-out electrode 60. In an exemplary embodiment, when the chip is bonded to the back plate 0, the anode of the chip may be bonded to the first lead-out electrode 50 via the first conductive connecting tube 20a, and the cathode of the chip may be bonded to the second lead-out electrode 60 via the second conductive connecting tube 20b. In the process of bonding the chip to the back plate 0, the first conductive connecting tube 20a and the second conductive connecting tube 20b may be heated. As the side walls of the first conductive connecting tube 20a and the second conductive connecting tube 20b are both provided with openings, in the heating process, air in the inner cavity of the first conductive connecting tube 20a can be discharged from the opening in the side wall of the first conductive connecting tube 20a, and air in the inner cavity of the second conductive connecting tube 20b can be discharged from the opening in the side wall of the second conductive connecting tube 20b. Therefore, bonding failure due to the increase of the air pressure in the inner cavity of the conductive connecting tube can be avoided, and the reliability of bonding between the chip and the back plate is improved.

Optionally, please continue referring to FIG. 4, the back plate 0 further includes: a flexible base layer 80 and a buffer layer 90 which are disposed between the base substrate 10 and the thin film transistor 30. The flexible base layer 80 and the buffer layer 90 are distributed in the direction away from the base substrate 10. The flexible base layer 80 may be of a multilayered structure formed by a plurality of polyimide (PI) film layers in a laminated fashion, which is not limited in the embodiments of the present disclosure.

Optionally, in the embodiments of the present disclosure, the hardness of the electrode of the chip is less than the hardness of the conductive connecting tube 20, which is convenient to insert the electrode of the chip into the conductive connecting tube 20. Therefore, pre-bonding between the electrode of the chip and the conductive connecting tube 20 is achieved, the electrode of the chip and the conductive connecting tube 20 are disposed, and mutual diffusion of molecules of the electrode of the chip and molecules of the conductive connecting tube is facilitated in the process of heating the chip and the conductive connecting tube 20, thereby realizing a reliable connection between the electrode of the chip and the conductive connecting tube 20. In an exemplary embodiment, the material of the electrode of the chip includes at least one of indium, copper, silver, gold, and aluminum, so that a softer texture of the electrode of the chip can be ensured, and the electrical conductivity of the electrode of the chip can be ensured.

As described above, the material of the conductive connecting tube 20 includes at least one of tungsten, niobium, titanium, and molybdenum, and the material of the electrode of the chip includes at least one of indium, copper, silver, gold, and aluminum. Please refer to Table 1 below, which shows the Mohs hardness and resistivity of tungsten (W), niobium (Nb), titanium (Ti), molybdenum (Mo), indium (In), copper (Cu), silver (Ag), gold (Au) and aluminum (Al). The material of the conductive connecting tube 20 and the material of the electrode of the chip may be determined according to Table 1, such that the material of the conductive connecting tube 20 and the material of the electrode of the chip have a big difference in Mohs hardness and a small difference in resistivity, to reduce the difficulty of bonding between the electrode of the chip and the conductive connecting tube 20 and ensure the bonding effect and the conductive effect between the electrode of the chip and the conductive connecting tube 20.

TABLE I

| Metal | W | Nb | Ti | Mo | Cu | Al | Ag | Au | In |
|---|---|---|---|---|---|---|---|---|---|
| Mohs hardness | 7.5 | 6.0 | 6.0 | 5.5 | 3.0 | 2.75 | 2.5 | 2.5 | 1.2 |
| Resistivity/ $n\Omega \cdot m$ | 53 | 25 | 420 | 52 | 16.73 | 26.55 | 14.7 | 23.5 | 88 |

In summary, the embodiment of the present disclosure provides a back plate. Since the side wall of the conductive connecting tube in the back plate is provided with an opening penetrating the side wall, in the process of heating the conductive connecting tube after inserting the electrode of the chip into the conductive connecting tube, the air in the inner cavity of the conductive connecting tube can be discharged through the opening in the side wall of the conductive connecting tube, which is favorable to ensure the reliability of bonding between the chip and the back plate.

The back plate according to the embodiments of the present disclosure may be applied to the following method. As for the manufacturing method and manufacturing principle of the back plate in the embodiments of the present disclosure, reference may be made to the descriptions in the following embodiments.

Figure 5:
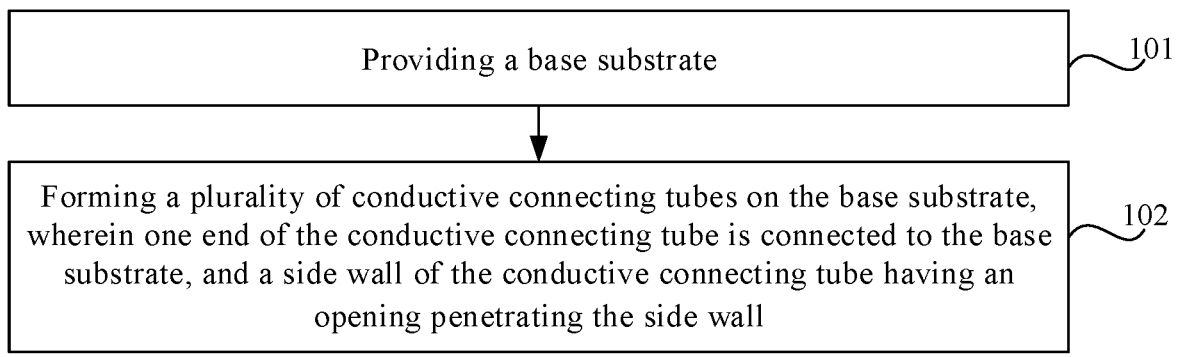
FIG. 5 is a flowchart of a method for manufacturing a back plate according to an embodiment of the present disclosure.

Please refer to FIG. 5, which shows a flowchart of a method for manufacturing a back plate according to an embodiment of the present disclosure. The method may be applied to manufacture the back plate 0 shown in FIG. 1 or FIG. 4. Referring to FIG. 5, the method may include the following steps.

In step 101, a base substrate is provided.

In step 102, a plurality of conductive connecting tubes are formed on the base substrate, wherein one end of the conductive connecting tube is connected to the base substrate, and a side wall of the conductive connecting tube is provided with an opening penetrating the side wall.

In summary, the embodiment of the present disclosure provides a method for manufacturing a back plate. The side wall of the conductive connecting tube in the back plate manufactured by the method is provided with an opening penetrating the side wall. In the process of heating the conductive connecting tube after inserting the electrode of the chip into the conductive connecting tube, air in the inner cavity of the conductive connecting tube can be discharged through the opening in the side wall of the conductive connecting tube, which is favorable to ensure the reliability of bonding between the chip and the back plate.

Figure 6:
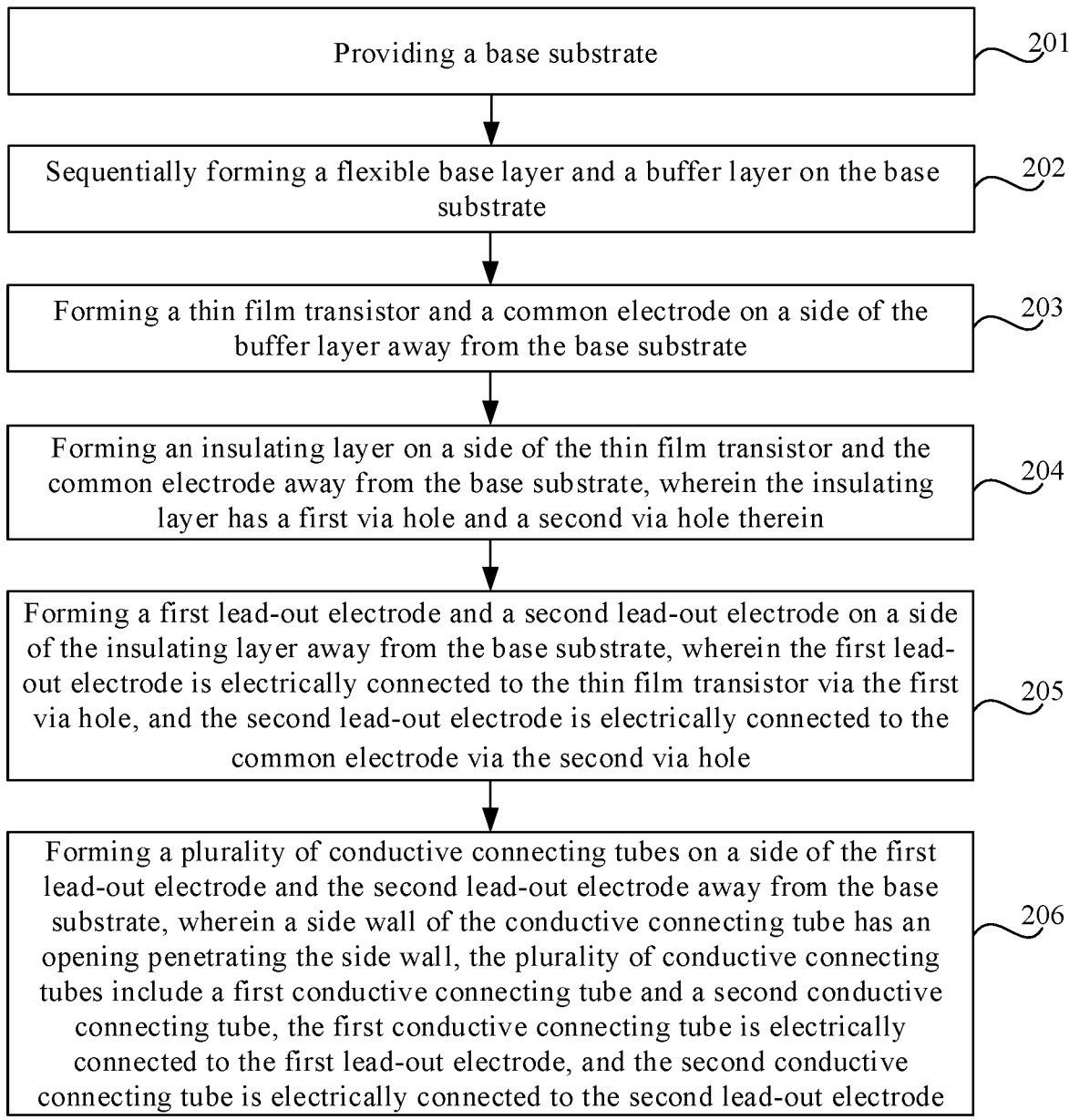
FIG. 6 is a flowchart of another method for manufacturing a back plate according to an embodiment of the present disclosure.

Please refer to FIG. 6, which shows a flowchart of another method for manufacturing a back plate according to an embodiment of the present disclosure. This method may be applied to manufacture the back plate 0 shown in FIG. 1 or FIG. 4. The present embodiment takes manufacturing of the back plate 0 shown in FIG. 4 as an example for illustration. Referring to FIG. 6, the method includes the following steps.

In step 201, a base substrate is provided.

The base substrate may be a rigid substrate made of a material with certain ruggedness, such as glass, quartz, or transparent resin. For example, the base substrate may be a glass substrate.

In step 202, a flexible base layer and a buffer layer are sequentially formed on the base substrate.

The material of the flexible base layer may be PI, and the material of the buffer layer may be any one of or any combination of silicon oxide (SiOx), silicon nitride (SiNx), and silicon oxynitride (SiOxNy).

In an exemplary embodiment, as shown in FIG. 4, firstly, a layer of PI solution is coated on the base substrate 10 and the PI solution is dried, to remove the solvent of the PI solution, so that the solute of the PI solution is retained to form a flexible base layer 80. Then, a layer of SiOx is deposited on the side of the flexible base layer 80 away from the base substrate 10 as a buffer layer 90.

In step 203, a thin film transistor and a common electrode are formed on the side of the buffer layer away from the base substrate.

In an exemplary embodiment, as shown in FIG. 4, the thin film transistor 30 includes: an active layer 301, a gate insulating layer 302, a gate 303, an interlayer dielectric layer 304, a source 305 and a drain 306. The source 305 and the drain 306 are disposed in the same layer. The active layer 301, the gate insulating layer 302, the gate 303, the interlayer dielectric layer 304 and the source 305 are distributed in the direction away from the base substrate 10. The common electrode 40, the source 305 and the drain 306 are disposed in the same layer. Optionally, the active layer 301, the gate insulating layer 302, the gate 303, and the interlayer dielectric layer 304 are sequentially formed on the side of the buffer layer 90 away from the base substrate 10. Then, a source via hole and a drain via hole are formed in the interlayer dielectric layer 304 and the gate insulating layer 302. Afterwards, the source 305, the drain 306, and the common electrode 40 are formed on the side of the interlayer dielectric layer 304 away from the base substrate 10, so that the source 305 is connected to the active layer 301 via the source via hole, and the drain 306 is connected to the active layer 301 via the drain via hole.

In step 204, an insulating layer is formed on the side of the thin film transistor and the common electrode away from the base substrate, wherein the insulating layer has a first via hole and a second via hole.

Optionally, the insulating layer is of a multilayered structure formed by a planarization layer and a passivation layer in a laminated fashion. The material of the planarization layer may be an organic material, and the material of the passivation layer may be any one or a combination of SiOx, SiNx or SiOxNy.

In an exemplary embodiment, firstly, the planarization layer is formed on the side of the thin film transistor 30 and the common electrode 40 away from the base substrate 10. Next, the passivation layer is formed on the side of the planarization layer away from the base substrate 10. The insulating layer 70 is formed by the planarization layer and the passivation layer in a laminated fashion. Then, the first via hole and the second via hole are formed in the insulating layer 70 by a patterning process. The first via hole corresponds to the drain 306 of the thin film transistor 30, and the drain 306 is at least partially exposed through the first via hole. The second via hole corresponds to the common electrode 40, and the common electrode 40 is at least partially exposed through the second via hole.

In step 205, a first lead-out electrode and a second lead-out electrode are formed on the side of the insulating layer away from the base substrate, wherein the first lead-out electrode is electrically connected to the thin film transistor via the first via hole, and the second lead-out electrode is electrically connected to the common electrode via the second via hole.

The first lead-out electrode and the second lead-out electrode are disposed in the same layer. Both of the material of the first lead-out electrode and the material of the second lead-out electrode may be a metal material, such as copper, aluminum, molybdenum, tungsten or the like.

In an exemplary embodiment, a metal aluminum material layer is formed on the side of the insulating layer 70 away from the base substrate 10 by a sputtering process, and the metal aluminum material layer is processed by a one-time patterning process to obtain a first lead-out electrode 50 and a second lead-out electrode 60. The first lead-out electrode 50 is electrically connected to the drain 306 of the thin film transistor 30 via the first via hole in the insulating layer 70, and the second lead-out electrode 60 is electrically connected to the common electrode 40 via the second via hole in the insulating layer 70.

In the embodiment of the present disclosure, a schematic diagram after the flexible base layer 80, the buffer layer 90, the thin film transistor 30, the common electrode 40, the insulating layer 70, the first lead-out electrode 50 and the second lead-out electrode 60 are formed on the base substrate 10 is as shown in FIG. 7.

In step 206, a plurality of conductive connecting tubes are formed on the side of the first lead-out electrode and the second lead-out electrode away from the base substrate. The side wall of the conductive connecting tube is provided with an opening penetrating the side wall. The plurality of conductive connecting tubes includes a first conductive connecting tube and a second conductive connecting tube. The first conductive connecting tube is electrically connected to the first lead-out electrode, and the second conductive connecting tube is electrically connected to the second lead-out electrode.

Each of the plurality of conductive connecting tubes may be as shown in FIG. 3. The side wall of the conductive connecting tube is provided with an opening 21 penetrating the side wall, and the opening 21 penetrates the conductive connecting tube along the axial direction of the conductive connecting tube. The plurality of conductive connecting tubes includes a first conductive connecting tube 20a and a second conductive connecting tube 20b. The first conductive connecting tube 20a is electrically connected to the first lead-out electrode 50, and the second conductive connecting tube 20b is electrically connected to the second lead-out electrode 60. Structures of the first conductive connecting tube 20a and the second conductive connecting tube 20b are both as shown in FIG. 3.

The implementation process of forming the conductive connecting tube is introduced as follows. Exemplarily, please refer to FIG. 8, which shows a flowchart of forming a conductive connecting tube on the side of the first lead-out electrode and the second lead-out electrode away from the base substrate according to an embodiment of the present disclosure. Referring to FIG. 8, the method may include the following steps.

In sub-step 2061, a base film layer is formed on the side of the first lead-out electrode and the second lead-out electrode away from the base substrate, wherein a plurality of via holes are formed in the base film layer.

Optionally, at first, the base film layer is formed on the side of the first lead-out electrode and the second lead-out electrode away from the base substrate. Then, a plurality of via holes are formed in the base film layer by the patterning process. The plurality of via holes may include at least one third via hole corresponding to the first lead-out electrode, and at least one fourth via hole corresponding to the second lead-out electrode. The first lead-out electrode is at least partially exposed through the at least one third via hole, and the second lead-out electrode is at least partially exposed through the at least one fourth via hole.

Figure 9:
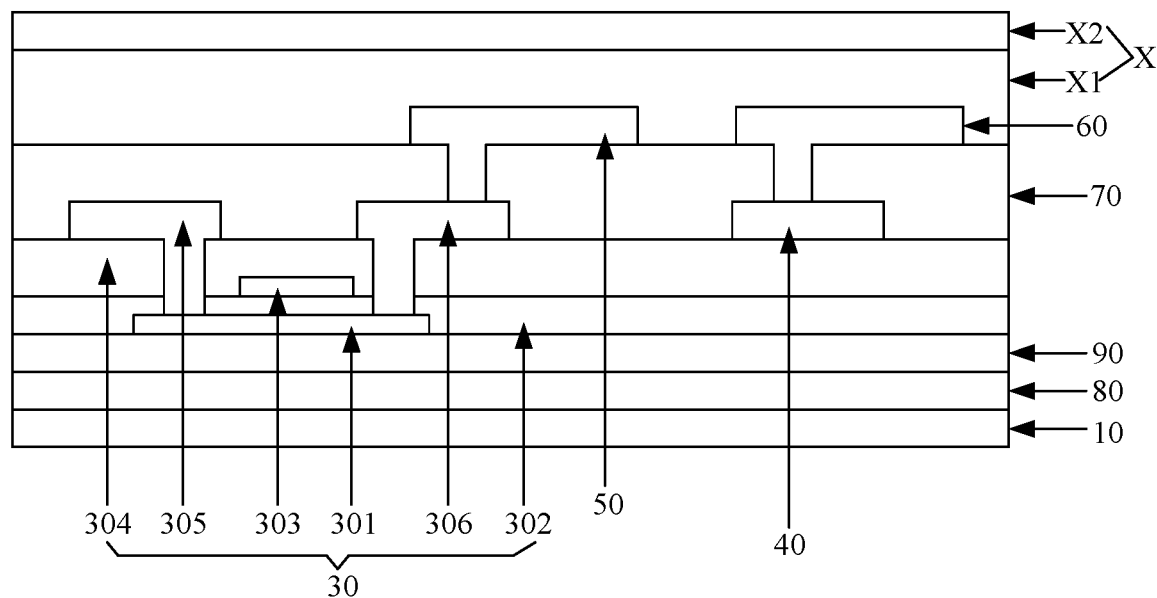
FIG. 9 is a schematic diagram illustrating forming a base film layer on a side of the first lead-out electrode and the second lead-out electrode away from the base substrate according to an embodiment of the present disclosure.

Optionally, the base film layer may be of a single-layer structure or a multilayered structure. Exemplarily, as shown in FIG. 9, the embodiment of the present disclosure takes an example in which the base film layer X is of a multilayered structure (FIG. 9 shows a double-layer structure) formed by a film layer X1 and a film layer X2 in a laminated fashion for illustration. The film layer X1 may be a planarization layer, and the material of the planarization layer may be an organic material. The film layer X2 may be a passivation layer, and the material of the passivation layer may be any one or a combination of SiOx, SiNx or SiOxNy. In an exemplary embodiment, at first, the film layer X1 (that is, the planarization layer) is formed on the side of the first lead-out electrode 50 and the second lead-out electrode 60 away from the base substrate 10, and then the film layer X2 (that is, the passivation layer) is formed on the side of the film layer X1 away from the base substrate 10. The film layer X1 and the film layer X2 are laminated to form the base film layer X.

Figure 10:
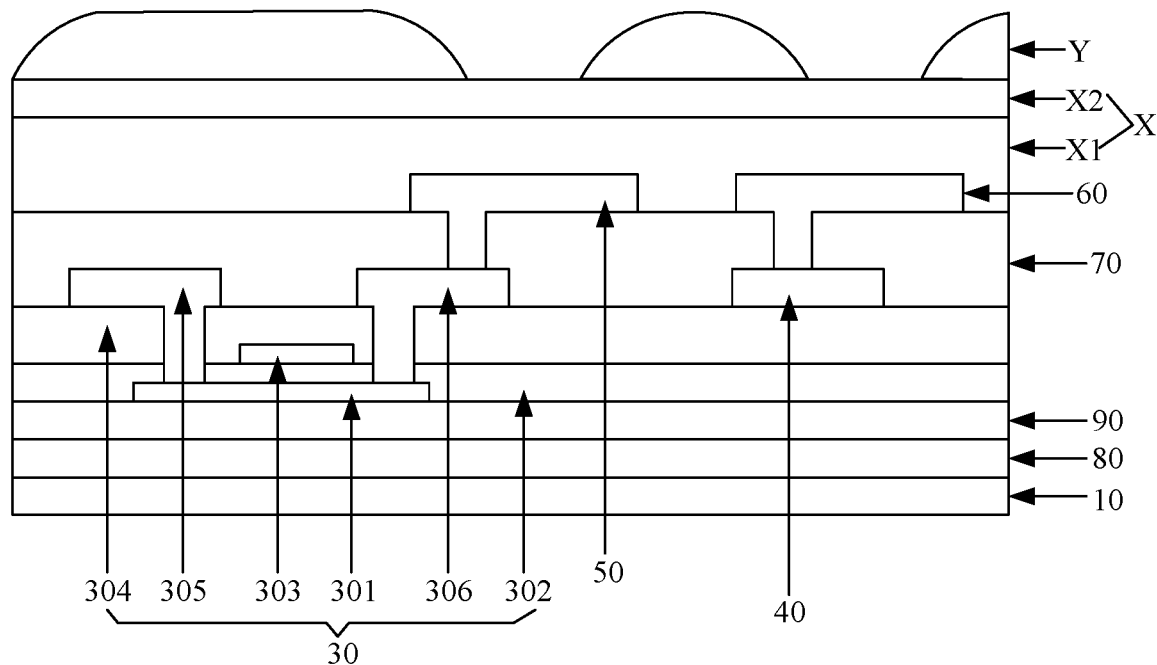
FIG. 10 is a schematic diagram after forming photoresist on a side of the base film layer away from the base substrate according to an embodiment of the present disclosure.
Figure 11:
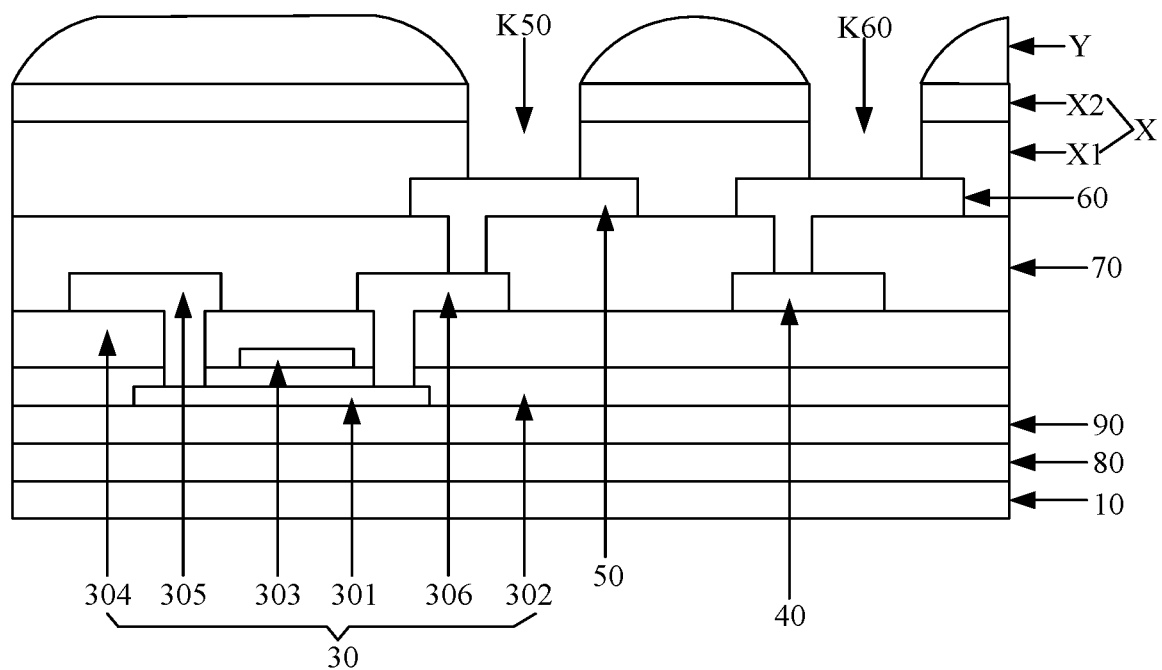
FIG. 11 is a schematic diagram after etching the base film layer according to an embodiment of the present disclosure.
Figure 12:
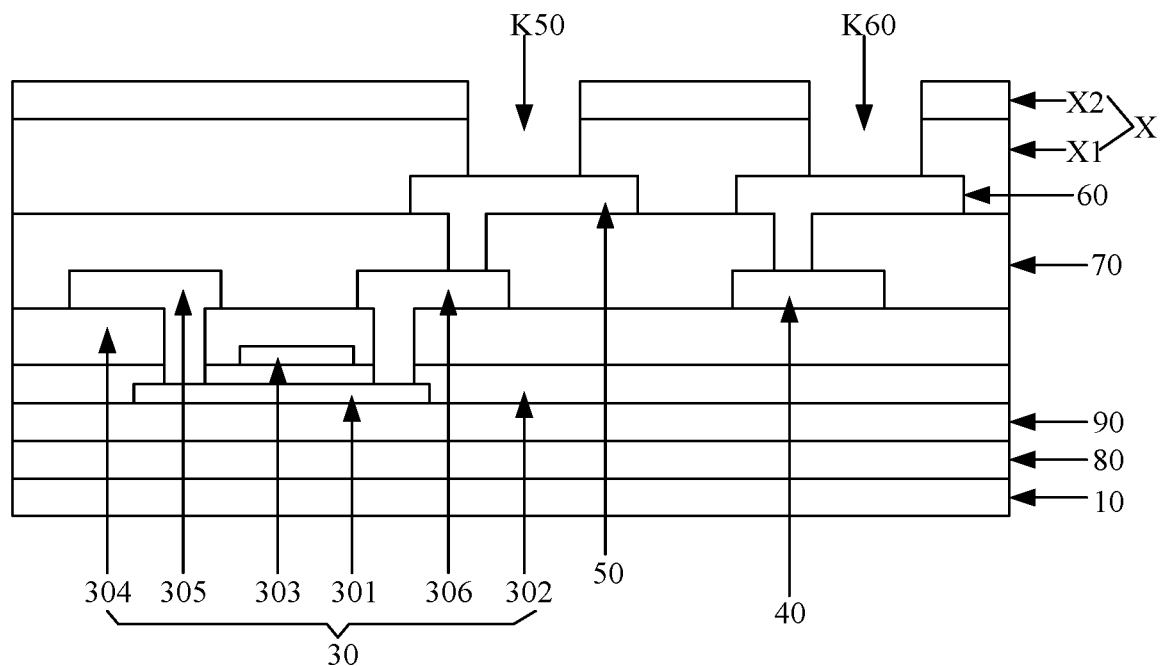
FIG. 12 is a schematic diagram after removing the photoresist according to an embodiment of the present disclosure.

Optionally, forming the plurality of via holes in the base film layer by the patterning process includes the followings. Firstly, photoresist Y is formed on the side of the base film layer X away from the base substrate 10, as shown in FIG. 10. Next, the base film layer X is etched by taking the photoresist as a mask to form the plurality of via holes in the base film layer X, as shown in FIG. 11. The plurality of via holes include a third via hole K50 corresponding to the first lead-out electrode 50 and a fourth via hole K60 corresponding to the second lead-out electrode 60. The first lead-out electrode 50 is at least partially exposed through the third via hole K50, and the second lead-out electrode 60 is at least partially exposed through the fourth via hole K60. Afterwards, the photoresist Y is removed, as shown in FIG. 12.

In the embodiment of the present disclosure, the side wall of the third via hole K50 may be perpendicular to the surface of the first lead-out electrode 50, and the side wall of the fourth via hole K60 may be perpendicular to the surface of the second lead-out electrode 60. In this way, it can be ensured that the axial directions of the conductive connecting tubes (including the first conductive connecting tube and the second conductive connecting tube) subsequently formed based on the via holes (including the third via hole K50 and the fourth via hole K60) are perpendicular to the surfaces of the lead-out electrodes (including the first lead-out electrode 50 and the second lead-out electrode 60), which guarantee uniform force in the conductive connecting tubes and the lead-out electrodes in the process of bonding the chip to the back plate, to avoid damages to the conductive connecting tubes and the lead-out electrodes, and reduce the bonding difficulty.

In sub-step 2062, a metal layer is formed on the side of the base film layer away from the base substrate. The metal layer is at least partially disposed in the plurality of via holes. The portions of the metal layer disposed in the plurality of via holes are in one-to-one correspondence with the plurality of conductive connecting tubes to be formed.

Optionally, the metal layer covers the base film layer and the plurality of via holes. The metal layer is partially disposed in the plurality of via holes and partially disposed on the base film layer. The material of the metal layer may include any one or a combination of tungsten, niobium, titanium and molybdenum.

Figure 13:
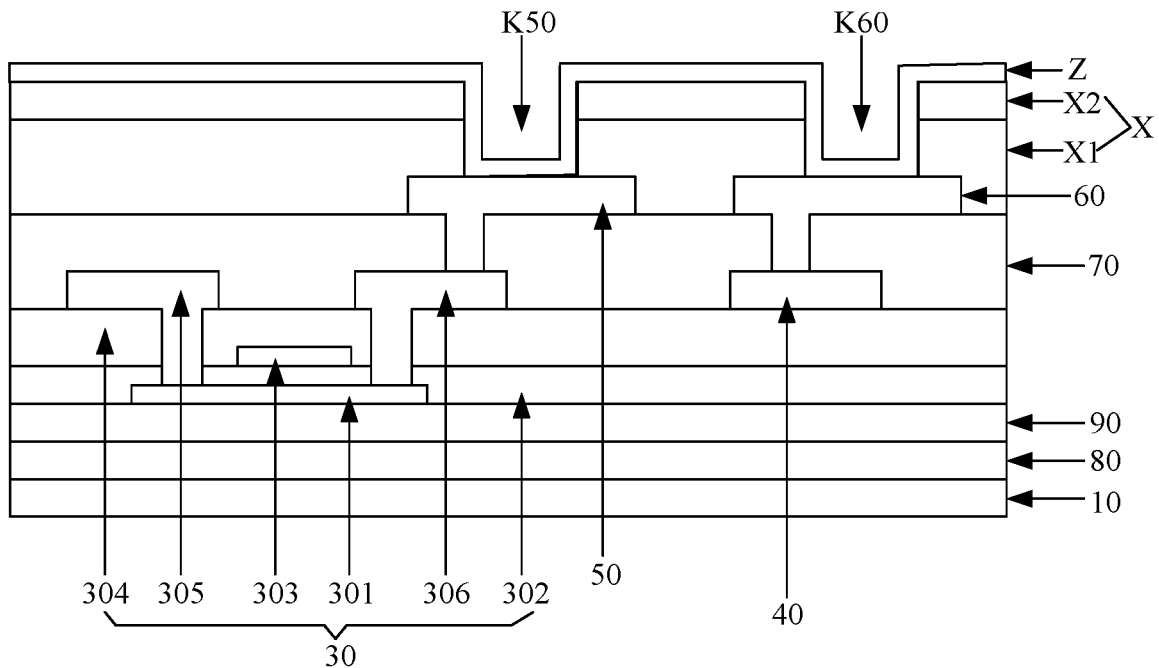
FIG. 13 is a schematic diagram after forming a metal layer on a side of the base film layer away from the base substrate according to an embodiment of the present disclosure.

In an exemplary embodiment, as shown in FIG. 13, a metal layer Z is formed on the side of the base film layer X away from the base substrate 10 by a magnetron sputtering process. A portion of the metal layer Z is disposed in the third via hole K50, a portion of the metal layer Z is disposed in the fourth via hole K60, and a portion of the metal layer Z is disposed on the base film layer X. The portion of the metal layer Z disposed in the third via hole K50 is electrically connected to the first lead-out electrode 50. The portion of the metal layer Z disposed in the fourth via hole K60 is electrically connected to the second lead-out electrode 60. The portion of the metal layer Z disposed in the third via hole K50 corresponds to the first conductive connecting tube to be formed, and the portion of the metal layer Z disposed in the fourth via hole K60 corresponds to the second conductive connecting tube to be formed.

In sub-step 2063, the metal layer is processed by a patterning process to obtain the plurality of conductive connecting tubes with openings, and the conductive connecting tubes are in one-to-one correspondence with the plurality of via holes.

Optionally, the photoresist is formed in the plurality of via holes first, so that the photoresist in each via hole covers a portion of the metal layer on the side wall of the via hole, but does not cover other portions of the metal layer on the side wall of the via hole. Next, the metal layer is etched by taking the photoresist as a mask to obtain the plurality of conductive connecting tubes with openings, and then the photoresist is removed.

Figure 14:
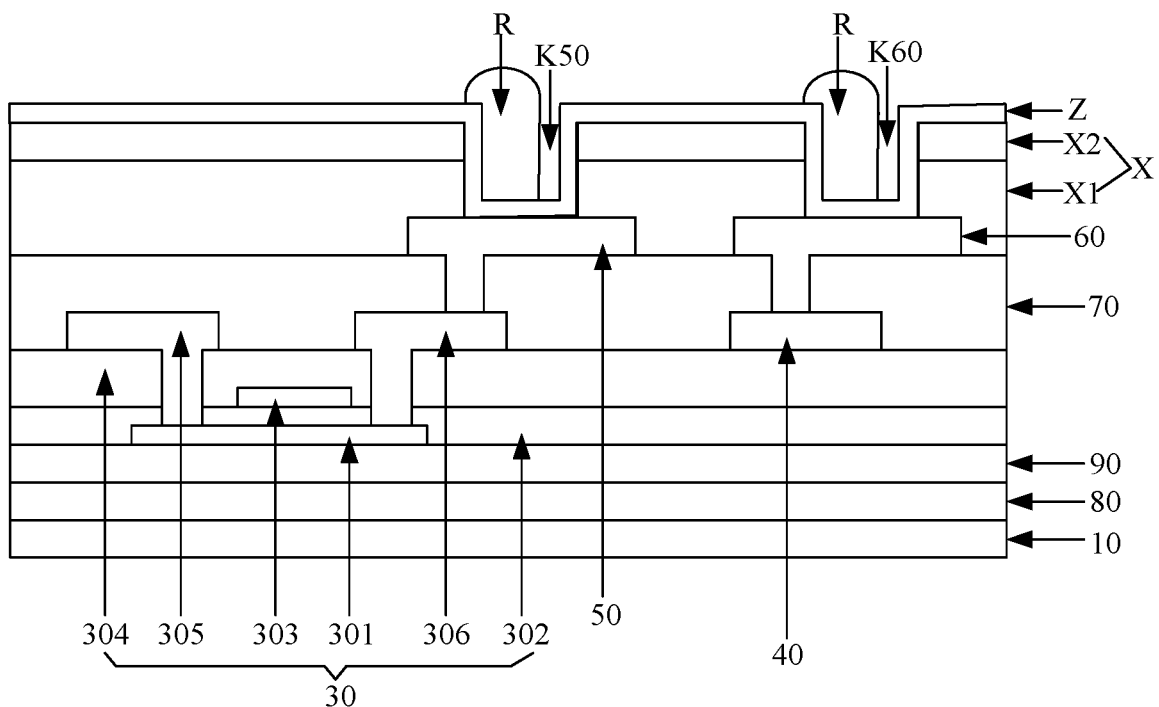
FIG. 14 is a schematic diagram after forming photoresist in a via hole according to an embodiment of the present disclosure.
Figure 15:
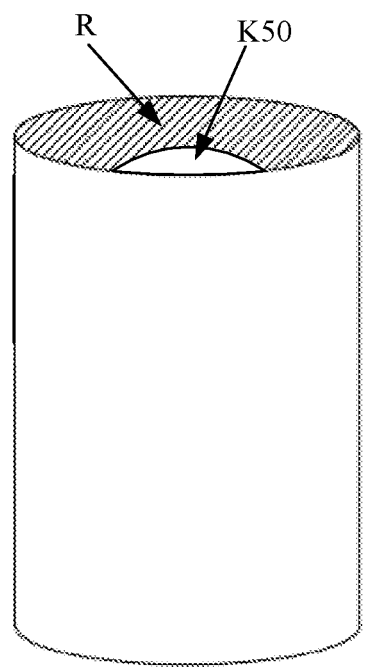
FIG. 15 is a perspective view after forming the photoresist in the via hole according to an embodiment of the present disclosure.
Figure 16:
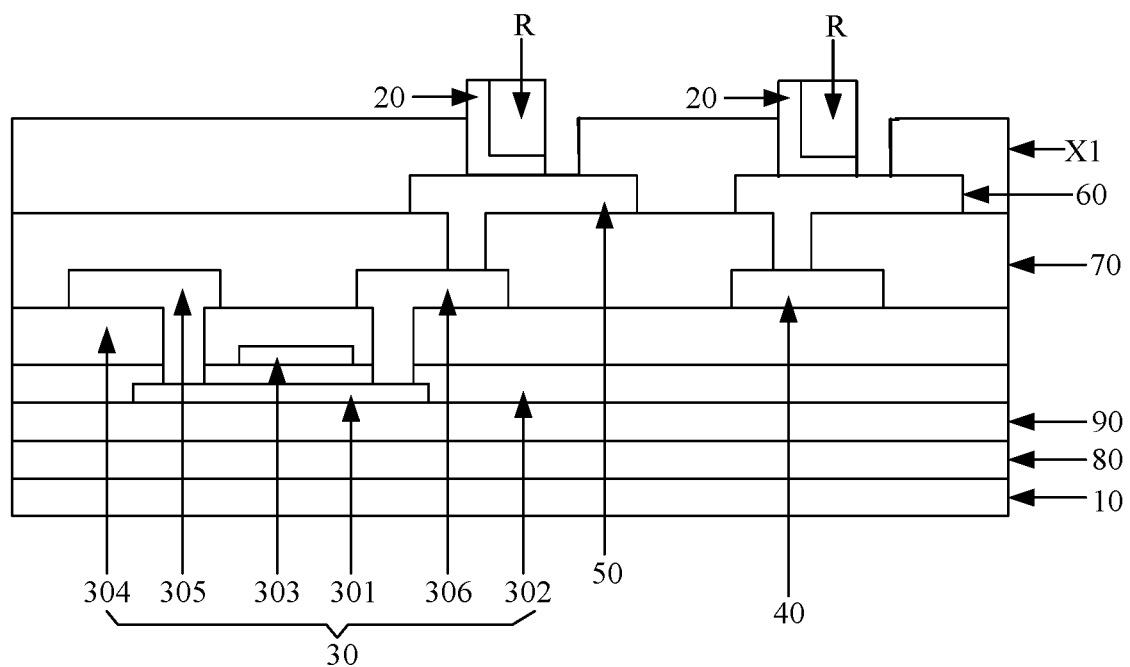
FIG. 16 is a schematic diagram after etching the metal layer according to an embodiment of the present disclosure.
Figure 17:
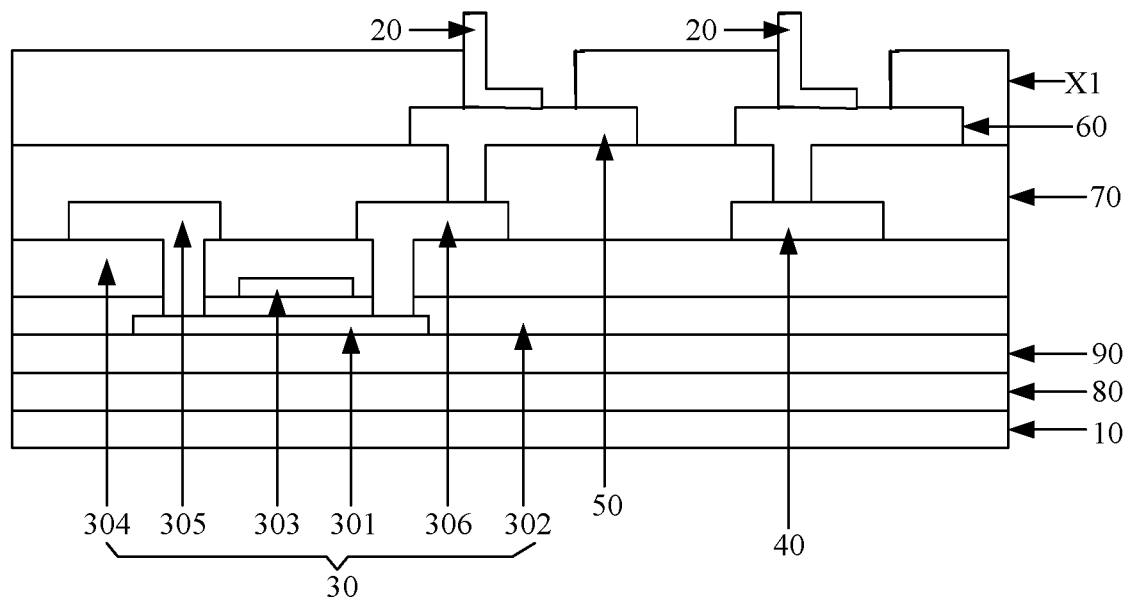
FIG. 17 is a schematic diagram after removing the photoresist according to an embodiment of the present disclosure.

In an exemplary embodiment, firstly, as shown in FIG. 14, photoresist R is formed in the third via hole K50 and the fourth via hole K60, so that the photoresist R in the third via hole K50 covers a portion of the metal layer Z on the side wall of the third via hole K50, and the photoresist R in the fourth via hole K60 covers a portion of the metal layer Z on the side wall of the fourth via hole K60. For example, the third via hole K50 and the fourth via hole K60 may be respectively filled with the photoresist, and then the photoresist is processed by the patterning process, to retain the portion of the photoresist in the third via hole K50 and the portion of the photoresist in the fourth via hole K60. FIG. 15 shows a schematic diagram after forming the photoresist R in the third via hole K50. The schematic diagram after forming the photoresist R in the fourth via hole K60 is similar to FIG. 15, and is not repeated herein. Next, as shown in FIG. 16, the metal layer Z is etched by taking the photoresist R as a mask to obtain the plurality of conductive connecting tubes 20 with openings. The structure of the conductive connecting tube 20 may be as shown in FIG. 3. Then, the photoresist R is removed (for example, the photoresist R is etched away with plasma), as shown in FIG. 17.

In the embodiment of the present disclosure, the metal layer Z may be etched by a dry etching process, which can ensure the accuracy of preparing the conductive connecting tube. In the embodiment of the present disclosure, since the conductive connecting tubes are prepared by the same process, the efficiency of processing the back plate is improved. As shown in FIG. 16, in the process of etching the metal layer Z with the photoresist R as a mask, the base film layer X under the metal layer Z may be over-etched, to remove the film layer X2 in the base film layer X, which is not limited in the embodiments of the present disclosure.

In sub-step 2064, the base film layer is removed.

Figure 18:
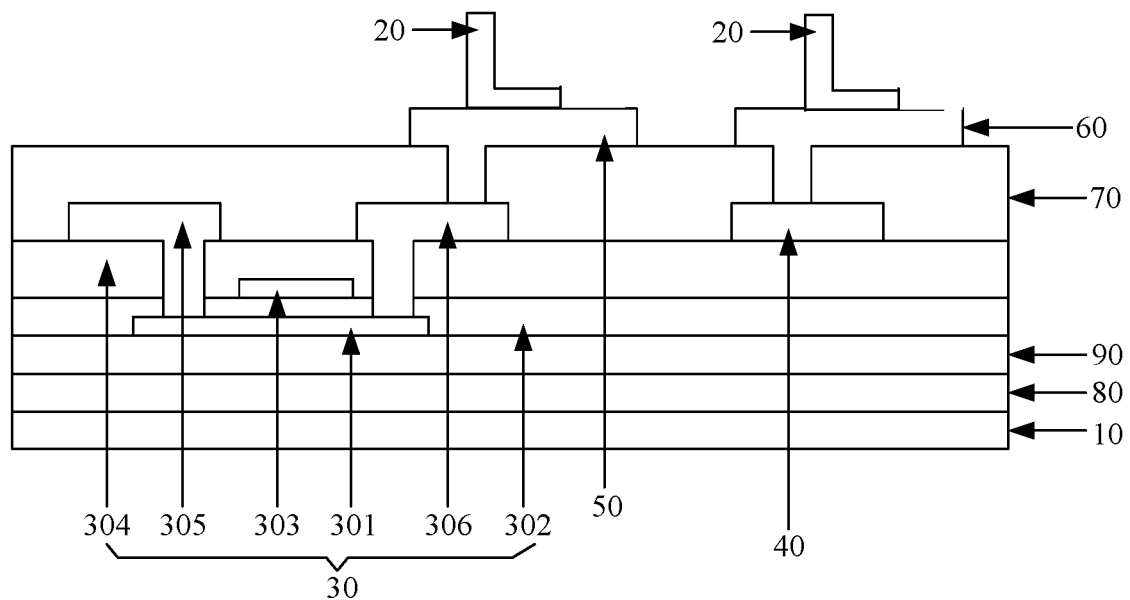
FIG. 18 is a schematic diagram after removing a base film layer according to an embodiment of the present disclosure.

Optionally, the base film layer may be removed by an etching process. For example, the film layer X1 in the base film layer X may be etched away with plasma. After the base film layer X is removed, the back plate as shown in FIG. 18 can be obtained. The back plate shown in FIG. 18 may be the same back plate as shown in FIG. 4, and the conductive connecting tube in FIG. 18 may be a side view of the conductive connecting tube shown in FIG. 4.

In summary, the embodiment of the present disclosure provides a method for manufacturing a back plate. The side wall of the conductive connecting tube in the back plate manufactured by the method is provided with an opening penetrating the side wall. In the process of heating the conductive connecting tube after inserting the electrode of the chip the conductive connecting tube, air in the inner cavity of the conductive connecting tube can be discharged through the opening in the side wall of the conductive connecting tube, which is favorable to ensure the reliability of bonding between the chip and the back plate.

The following introduces the method for bonding a chip according to an embodiment of the present disclosure.

Figures 19, 20:
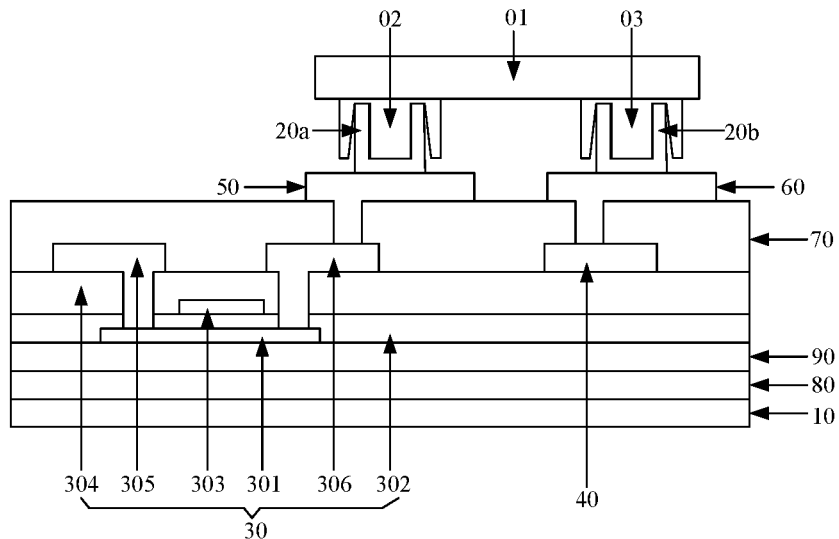
FIG. 19 is a flowchart of a method for bonding a chip according to an embodiment of the present disclosure.
FIG. 20 is a schematic structural diagram of an array substrate according to an embodiment of the present disclosure.

Please refer to FIG. 19, which shows a flowchart of a method for bonding a chip according to an embodiment of the present disclosure. The method may be applied to bond a chip to the back plate 0 shown in FIG. 1 or FIG. 4. Referring to FIG. 19, the method includes the following steps.

In step 301, a back plate is provided. The back plate includes a base substrate and a plurality of conductive connecting tubes disposed on the base substrate. One end of the conductive connecting tube is connected to the base substrate, and a side wall of the conductive connecting tube is provided with an opening penetrating the side wall.

Here, the back plate may be as shown in FIG. 1 or FIG. 4. As for the structure of the back plate and the manufacturing method of the back plate, reference may be made to the foregoing embodiments, which are not repeated in the embodiment of the present disclosure.

In step 302, an electrode of the chip is inserted into the conductive connecting tube from the end of the conductive connecting tube away from the base substrate.

Optionally, the chip may be a micro LED chip, the electrode of the chip includes an anode and a cathode. The plurality of conductive connecting tubes include a first conductive connecting tube and a second conductive connecting tube. The anode of the chip may be inserted into the first conductive connecting tube from the end of the first conductive connecting tube away from the base substrate, and the cathode of the chip may be inserted into the second conductive connecting tube from the end of the second conductive connecting tube away from the base substrate. Alternatively, the cathode of the chip may be inserted into the first conductive connecting tube from the end of the first conductive connecting tube away from the base substrate, and the anode of the chip may be inserted into the second conductive connecting tube from the end of the second conductive connecting tube away from the base substrate, which is not limited in the embodiments of the present disclosure.

In an exemplary embodiment, please refer to FIG. 20, which shows a schematic diagram after bonding the chip 01 to the back plate 0 shown in FIG. 4. The thin film transistor 30 in the back plate 0 is a PMOS transistor, and the chip 01 includes an anode 02 and a cathode 03. The anode 02 is inserted into the first conductive connecting tube 20a in the back plate 0, and the cathode 03 is inserted into the second conductive connecting tube 20b in the back plate 0.

In step 303, the conductive connecting tube and the chip are heated, so that the electrode of the chip is electrically connected to the conductive connecting tube.

Optionally, the conductive connecting tube and the chip may be heated by a heating device, so that molecules of the electrode of the chip and molecules of the conductive connecting tube are mutually diffused. In this way, the electrode of the chip and the conductive connecting tube are fixedly connected and conducted, a stable electrical connection is established between the electrode of the chip and the conductive connecting tube. The chip is bonded to the back plate by the conductive connecting tube. In the process of heating the conductive connecting tube, air in the inner cavity of the conductive connecting tube can be discharged through the opening in the side wall of the conductive connecting tube, which avoids the bonding failure caused by the increase of an air pressure in the inner cavity of the conductive connecting tube, and improves the reliability of bonding between the chip and the back plate.

In summary, the embodiment of the present disclosure provides a method for bonding a chip. The side wall of the conductive connecting tube in the back plate is provided with an opening penetrating the side wall. In the process of heating the conductive connecting tube after inserting the electrode of the chip into the conductive connecting tube, air in the inner cavity of the conductive connecting tube can be discharged through the opening in the side wall of the conductive connecting tube, which is favorable to ensure the reliability of bonding between the chip and the back plate.

Based on the same inventive concept, an embodiment of the present disclosure provides a display device. The display device includes a chip and the back plate provided in the foregoing embodiments. The chip and the back plate are bonded by the method for bonding a chip in the foregoing embodiment. In an exemplary embodiment, the display device may be the substrate as shown in FIG. 20, and the substrate may be an array substrate. In the display device, an electrode of the chip is bonded to a conductive connecting tube in the back plate. In the back plate, the conductive connecting tube is electrically connected to a thin film transistor by a lead-out electrode, so the electrode of the chip is electrically connected to the thin film transistor in the back plate. Light emission of the chip can be controlled by turning on the thin film transistor, and extinguishment of the chip may be controlled by turning off the thin film transistor. Thus, the light emission and extinguishment of the chip is controlled, and thus display of the display device is achieved.

Optionally, the chip may be a micro LED chip, and the hardness of the electrode of the chip is less than the hardness of the conductive connecting tube in the back plate, to facilitate the bonding between the chip and the back plate. In an exemplary embodiment, the material of the electrode of the chip includes any one or a combination of indium, copper, silver, gold and aluminum, and the material of the conductive connecting tube includes any one or a combination of tungsten, niobium, titanium and molybdenum.

Optionally, the display device may be any product or component with a display function, such as a piece of electronic paper, a mobile phone, a tablet computer, a television, a display, a notebook computer, a digital photo frame, a navigator, a wearable device, an AR device, a VR device, a theater large screen or the like.

In the method for manufacturing a back plate and the method for bonding a chip according to the embodiments of the present disclosure, the sequence of the steps may be adjusted appropriately, and the steps may also be added or removed based on situations. Various methods that are easily derived for those skilled in the art within the technical scope of the present disclosure should be included in the protection scope of the present disclosure, and details are not repeated herein.

The one-time patterning process described in the embodiments of the present disclosure may include: photoresist coating, exposure, development, etching, and photoresist stripping. Therefore, processing a material layer (for example, a metal aluminum material layer) by the one-time patterning process may include: first, coating a layer of photoresist on the material layer (for example, the metal aluminum material layer); next, using a mask to expose the photoresist, so that the photoresist forms a fully exposed area and a non-exposed area; then, processing the exposed photoresist by a development process, so that the photoresist in the fully exposed area, and the photoresist in the non-exposed area is retained; afterwards, etching the area, corresponding to the fully exposed area, on the material layer (for example, the metal aluminum material layer) by an etching process; and finally, striping the photoresist in the non-exposed area. In this way, corresponding structures (for example, the first lead-out electrode 50 and the second lead-out electrode 60) are formed in the area, corresponding to the non-exposed area, on the material layer (for example, the metal aluminum material layer). It is easy to understand that positive photoresist is taken as an example to illustrate the one-time patterning process in the embodiments of the present disclosure. The photoresist used in the one-time patterning process may be negative photoresist, which is not repeated in the embodiments of the present disclosure.

In the present disclosure, the term "disposed in the same layer" refers to a relationship between layers formed at the same time in the same step. For example, in an example, when the first lead-out electrode 50 and the second lead-out electrode 60 are formed after one or more steps in the same patterning process performed in the same layer of material, the first lead-out electrode 50 and the second lead-out electrode 60 are disposed in the same layer. In another example, the first lead-out electrode 50 and the second lead-out electrode 60 may be formed in the same layer by simultaneously performing the steps of forming the first lead-out electrode 50 and the second lead-out electrode 60. The term "disposed in the same layer" does not always mean that the layer thickness or layer height in a cross-sectional view is the same.

The terms "first", "second", "third" and other similar descriptions in the present disclosure are merely used for description, and cannot be construed as denoting or implying any relative importance. The term "at least one" refers to one or plurality, and "a plurality of" means two or more. The term "electrically connected" refers to connection with the capability of charge transfer, but presence of charge transfer is unnecessary. For example, electrical connection between A and B indicates that A and B are connected and charges can be transferred between A and B, but the presence of charge transfer is unnecessary between A and B.

Described above are merely example embodiments of the present disclosure and an illustration of the applied technical principles. Those skilled in the art should understand that the application scope involved in the present disclosure is not limited to the technical solutions formed by specific combinations of the above technical features, and should also cover other technical solutions formed by any combination of the above technical features and equivalent features thereof, without departing from the concept of the present disclosure, for example, the technical solutions formed by mutual substitution of the above features with the technical features with similar functions in the present disclosure (but not limited thereto).

What is claimed is:

1. A back plate, comprising:
    a base substrate;
    a plurality of conductive connecting tubes disposed on the base substrate, wherein one end of each of the conductive connecting tubes is connected to the base substrate, and a side wall of each of the conductive connecting tubes is provided with an opening penetrating the side wall;
    a thin film transistor which is disposed on the base substrate, wherein the plurality of conductive connecting tubes comprises a first conductive connecting tube disposed on a side of the thin film transistor away from the base substrate, and the first conductive connecting tube is electrically connected to the thin film transistor; and
    a common electrode which is disposed on the base substrate, wherein the plurality of conductive connecting tubes further comprises a second conductive connecting tube disposed on a side of the common electrode away from the base substrate, and the second conductive connecting tube is electrically connected to the common electrode.

2. The back plate according to claim 1, further comprising:
    a first lead-out electrode and a second lead-out electrode, wherein the first conductive connecting tube is electrically connected to the thin film transistor via the first lead-out electrode, and the second conductive connecting tube is electrically connected to the common electrode via the second lead-out electrode.

3. The back plate according to claim 2, wherein
    the first lead-out electrode and the second lead-out electrode are disposed on the side of the thin film transistor away from the base substrate and the side of the common electrode away from the base substrate; and
    the conductive connecting tubes are disposed on a side of the first lead-out electrode away from the base substrate and a side of the second lead-out electrode away from the base substrate.

4. The back plate according to claim 3, wherein further comprising:
    an insulating layer having a first via hole and disposed between the thin film transistor and the first lead-out electrode, and an insulating layer having a second via hole and disposed between the common electrode and the second lead-out electrode, wherein the first lead-out electrode is electrically connected to the thin film transistor via the first via hole, and the second lead-out electrode is electrically connected to the common electrode via the second via hole.

5. A display device, comprising a chip and the back plate according to claim 1, wherein the chip has at least one of the following characteristics:
    hardness of the electrode of the chip is less than hardness of the conductive connecting tube;
    a material of the electrode of the chip comprises at least one of indium, copper, silver, gold and aluminum; and
    the chip is a micro light-emitting diode chip.

6. The display device according to claim 5, wherein
the opening is disposed in the side wall at the end of each of the conductive connecting tubes connected to the base substrate.

7. The display device according to claim 6, wherein
a thickness of the side wall at the end of each of the conductive connecting tubes connected to the base substrate is greater than or equal to 1000 angstroms.

8. The back plate according to claim 1, wherein
the opening is disposed in the side wall at the end of each of the conductive connecting tubes connected to the base substrate.

9. The back plate according to claim 8, wherein
a thickness of the side wall at the end of each of the conductive connecting tubes connected to the base substrate is greater than or equal to 1000 angstroms.

10. The back plate according to claim 1, wherein
the opening penetrates the side wall along an axial direction of each of the conductive connecting tubes.

11. The back plate according to claim 10, wherein
a thickness of the side wall of each of the conductive connecting tubes is greater than or equal to 1000 angstroms.

12. The back plate according to claim 1, wherein
an extending length of the opening in a circumferential direction of each of the conductive connecting tubes is less than or equal to one-sixth of a circumferential length of each of the conductive connecting tubes.

13. The back plate according to claim 1, wherein
a material of each of the conductive connecting tubes comprises at least one of tungsten, niobium, titanium and molybdenum.

14. A method for manufacturing a back plate, comprising:
providing a base plate; and
forming a plurality of conductive connecting tubes on the base substrate, wherein one end of each of the conductive connecting tubes is connected to the base substrate, and a side wall of each of the conductive connecting tubes is provided with an opening penetrating the side wall;
wherein prior to forming the plurality of conductive connecting tubes on the base substrate, the method further comprises:
forming a thin film transistor and a common electrode on the base substrate;
and forming the plurality of conductive connecting tubes on the base substrate comprises:
forming the plurality of conductive connecting tubes, wherein the plurality of conductive connecting tubes comprises a first conductive connecting tube disposed on a side of the thin film transistor away from the base substrate, and the first conductive connecting tube is electrically connected to the thin film transistor, wherein the plurality of conductive connecting tubes further comprises a second conductive connecting tube disposed on a side of the common electrode away from the base substrate, and the second conductive connecting tube is electrically connected to the common electrode.

15. The method according to claim 14, wherein forming the plurality of conductive connecting tubes on the base substrate comprises:
forming a base film layer on the base substrate, wherein the base film layer has a plurality of via holes;
forming a metal layer on a side of the base film layer away from the base substrate, wherein the metal layer is at least partially disposed in the plurality of via holes, and portions of the metal layer disposed in the plurality of via holes are in one-to-one correspondence with the plurality of conductive connecting tubes to be formed;
processing the metal layer by a patterning process to obtain the plurality of conductive connecting tubes with the openings, wherein the conductive connecting tubes are in one-to-one correspondence with the plurality of via holes; and
removing the base film layer.

16. The method according to claim 15, wherein
processing the metal layer by the patterning process to obtain the plurality of conductive connecting tubes with the openings, comprises:
forming photoresist in the plurality of via holes, so that the photoresist in each via hole covers a portion of the metal layer on a side wall of the via hole;
etching the metal layer by taking the photoresist as a mask, to obtain the plurality of conductive connecting tubes with the openings; and
removing the photoresist.

17. The method according to claim 14, wherein
prior to forming the plurality of conductive connecting tubes on the side of the thin film transistor and the common electrode away from the base substrate, the method further comprises:
forming a first lead-out electrode and a second lead-out electrode on the side of the thin film transistor away from the base substrate and the side of the common electrode away from the base substrate, wherein the first lead-out electrode is electrically connected to the thin film transistor, and the second lead-out electrode is electrically connected to the common electrode; and
forming the plurality of conductive connecting tubes on the side of the thin film transistor and the common electrode away from the base substrate comprises:
forming the plurality of conductive connecting tubes on a side of the first lead-out electrode away from the base substrate and a side of the second lead-out electrode away from the base substrate, wherein the first conductive connecting tube is electrically connected to the first lead-out electrode, and the second conductive connecting tube is electrically connected to the second lead-out electrode.

18. The method according to claim 17, wherein
prior to forming the first lead-out electrode and the second lead-out electrode on the side of the thin film transistor and the common electrode away from the base substrate, the method further comprises:
forming an insulating layer on the side of the thin film transistor away from the base substrate and the side of the common electrode away from the base substrate, wherein the insulating layer has a first via hole and a second via hole; and
forming the first lead-out electrode and the second lead-out electrode on the side of the thin film transistor and the common electrode away from the base substrate comprises:
forming the first lead-out electrode and the second lead-out electrode on a side of the insulating layer away from the base substrate, wherein the first lead-out electrode is electrically connected to the thin film transistor via the first via hole, and the second lead-out electrode is electrically connected to the common electrode via the second via hole.

19. A method for bonding a chip, comprising:
providing a back plate, wherein the back plate comprises a base substrate and a plurality of conductive connecting tubes disposed on the base substrate, one end of each of the conductive connecting tube being connected to the base substrate, and a side wall of each of the conductive connecting tube being provided with an opening penetrating the side wall;

inserting an electrode of the chip into a corresponding conductive connecting tube from an end of the conductive connecting tube away from the base substrate; and heating the conductive connecting tube and the chip, so that the electrode of the chip is electrically connected to the conductive connecting tube.

20. The method according to claim 19, wherein the electrode of the chip comprises an anode and a cathode, and the plurality of conductive connecting tubes comprise a first conductive connecting tube and a second conductive connecting tube; and inserting the electrode of the chip into a corresponding conductive connecting tube from the end of the conductive connecting tube away from the base substrate comprises:

inserting the anode of the chip into the first conductive connecting tube from an end of the first conductive connecting tube away from the base substrate, and inserting the cathode of the chip into the second conductive connecting tube from an end of the second conductive connecting tube away from the base substrate.

* * * * *